United States Patent [19]
Yamasaki

[11] Patent Number: 5,925,213
[45] Date of Patent: Jul. 20, 1999

[54] WET PROCESSING APPARATUS WITH MOVABLE PARTITIONING PLATE BETWEEN TWO PROCESSING CHAMBERS

[75] Inventor: Shinya Yamasaki, Tokyo, Japan

[73] Assignee: NEC Corporation, Tokyo, Japan

[21] Appl. No.: 08/938,807

[22] Filed: Sep. 26, 1997

[30] Foreign Application Priority Data

Sep. 30, 1996 [JP] Japan ................................. 8-257250

[51] Int. Cl.⁶ .................................................. H01L 21/00
[52] U.S. Cl. ........................................ 156/345; 438/745
[58] Field of Search ................... 156/345 L, 345 LC, 156/345 PC, 345 MC; 216/83, 91; 438/745

[56] References Cited

U.S. PATENT DOCUMENTS 4,957,583  9/1990  Buck ........................................ 156/345
5,022,949  6/1991  Jengo ....................................... 156/345

FOREIGN PATENT DOCUMENTS 5-343387  12/1993  Japan .

*Primary Examiner*—William Powell
*Attorney, Agent, or Firm*—Young & Thompson

[57] ABSTRACT

In a wet processing apparatus including a first processing chamber for carrying out a first process with first chemicals and a second processing chamber for carrying out a second process with second chemicals, a separation cell is provided between the first and second processing chambers and receives pure water therein. Also, a movable partitioning plate is provided between the first and second processing chambers, to partition the first processing chamber from the second processing chamber. A lower end of the movable partitioning plate is immersed below a surface of pure water of the separation cell.

5 Claims, 6 Drawing Sheets

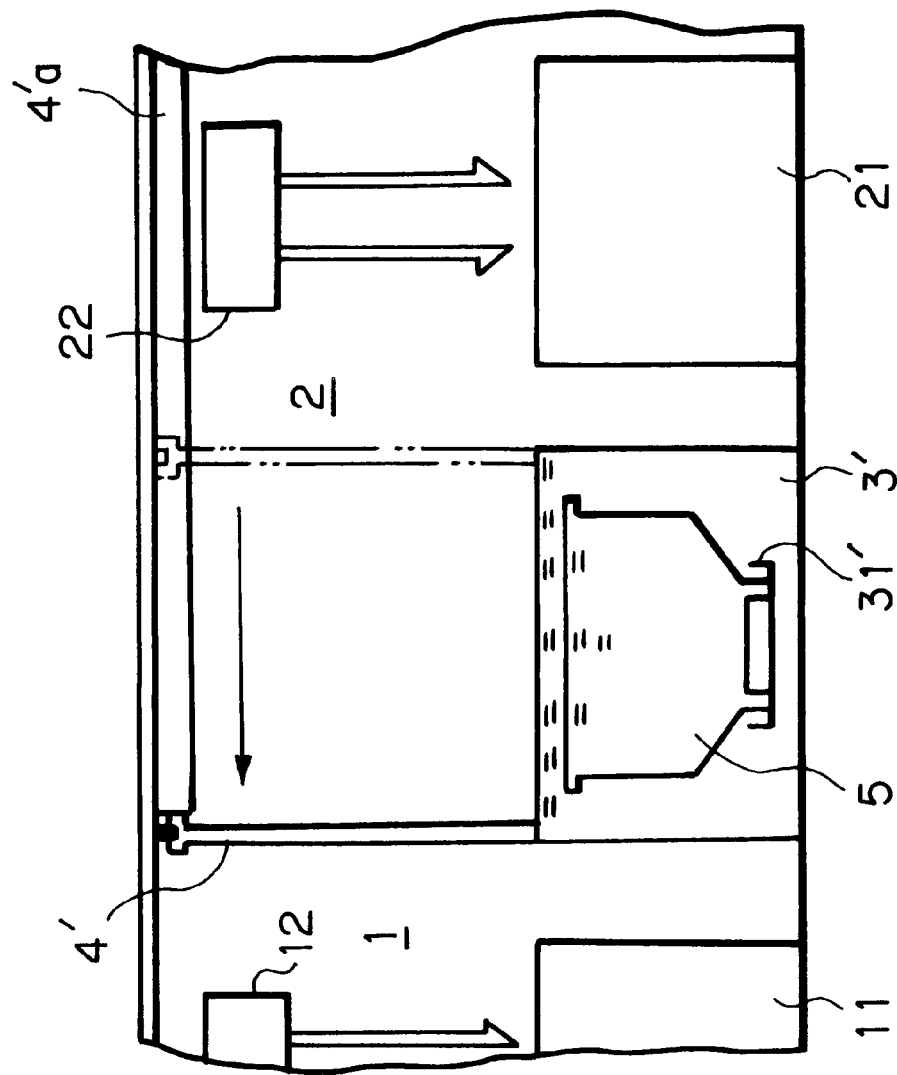

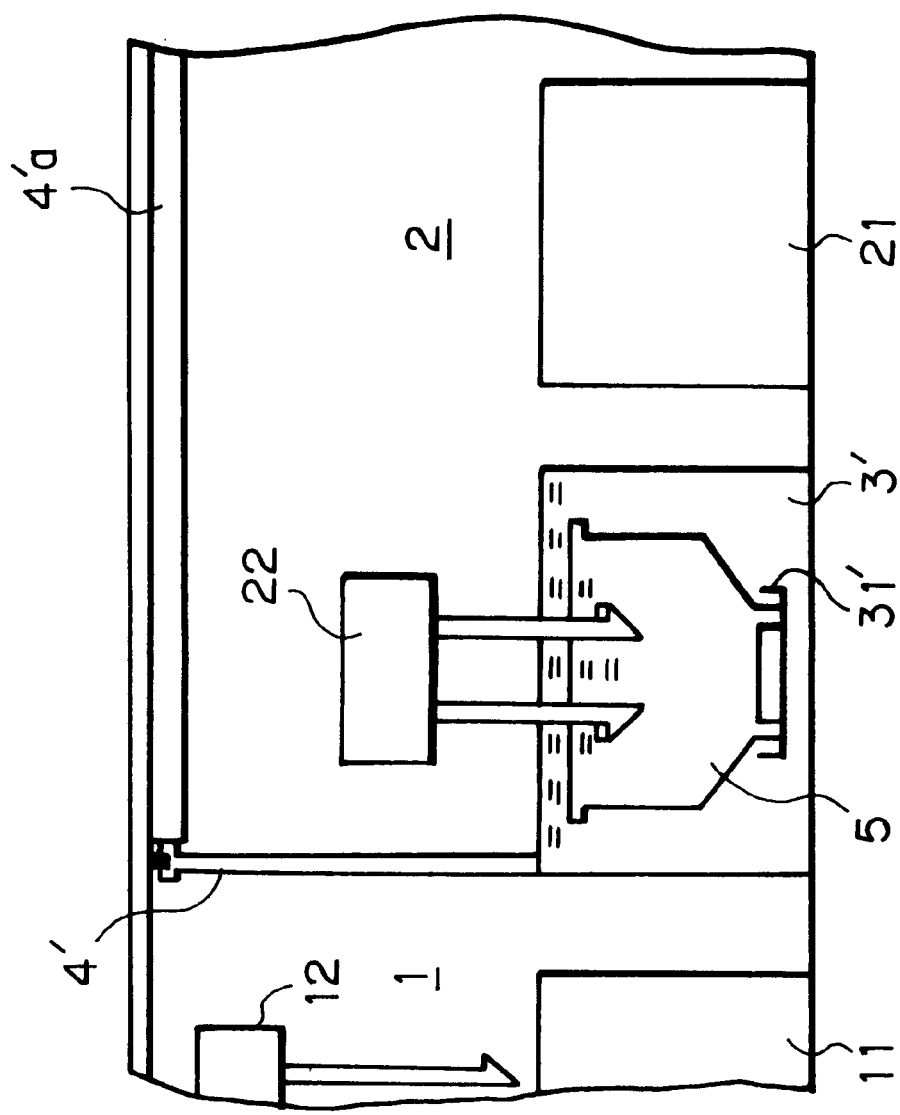

WET PROCESSING APPARATUS WITH MOVABLE PARTITIONING PLATE BETWEEN TWO PROCESSING CHAMBERS

BACKGROUND OF THE INVENTION

1. Field of the Invention

The present invention relates to a wet processing apparatus used in the manufacture of semiconductor devices and liquid crystal display (LCD) panels.

2. Description of the Related Art

In the manufacture of semiconductor devices and LCD panels, wet processing steps for removing contamination therefrom are so essential that the manufacturing yield is dependent thereupon. Generally, a wet processing step using an alkali solution such as an anmonia water/hydrogen peroxide water mixture (APM) is applied to remove nonorganic particles, and a wet processing step using an acid solution such as a hydrosulfurous acid/hydrogen peroxide water mixture (SPM) or hydrochloric acid/hydrogen peroxide water mixture (HPM) is applied to remove metal particles. Also, a wet processing step using an alcohol solution such as an isopropyl alcohol solution (IPA) is to remove organic particles.

Two or more of the above-mentioned wet processing steps are often carried out in a single wet processing apparatus.

A prior art wet processing apparatus is formed by a first processing chamber for carrying out a first process with first chemicals, a second processing chamber for carrying out a second process with second chemicals, and a separation cell provided between the first and second processing chambers and receiving pure water therein, a partitioning plate is fixed between the first and second processing chambers, to partition the first processing chamber from the second processing chamber. In this case, a lower end of the partitioning plate is immersed below a surface of pure water of the separation cell (see JP-A-5-343387). This will be explained later in detail.

In the prior art wet processing apparatus, since a wafer carrier for accommodating wafers has to be moved within the separation cell from one of the chambers to the other chamber or vice versa, the separation cell is large in size. This increases consumption of pure water. In addition, the motion of the wafers within the separation cell generates static electricity between the wafers and pure water, so that the wafers are charged which destroys the function thereof.

SUMMARY OF THE INVENTION

It is an object of the present invention to reduce the consumption of pure water in a wet processing apparatus.

Another object is to avoid destruction of the function of wafers processed in the wet processing apparatus.

According to the present invention, in a wet processing apparatus including a first processing chamber for carrying out a first process with first chemicals and a second processing chamber for carrying out a second process with second chemicals, a separation cell is provided between the first and second processing chambers and receives pure water therein. Also, a movable partitioning plate is provided between the first and second processing chambers, to partition the first processing chamber from the second processing chamber. A lower end of the movable partitioning plate is immersed below a surface of pure water of the separation cell. Thus, the separation cell can be reduced in size, which reduces the consumption of pure water.

Also, a supporting bed for supporting a carrier for accommodating wafers is fixed to the separation cell. In other words, the supporting bed is not moved within the separation cell. As a result, static electricity is not generated, and accordingly, the wafers are not charged, thus avoiding the destruction of the function of the wafers.

BRIEF DESCRIPTION OF THE DRAWINGS

The present invention will be more clearly understood from the description as set forth below, in comparison with the prior art, with reference to the accompanying drawings, wherein:

FIGS. 2A, 2B and 2C are diagrams illustrating an embodiment of the wet processing apparatus according to the present invention;

DESCRIPTION OF THE PREFERRED EMBODIMENT

Before the description of the preferred embodiment, a prior art wet processing apparatus will be explained with reference to FIG. 1 (see JP-A-5-343387).

Figure 1:
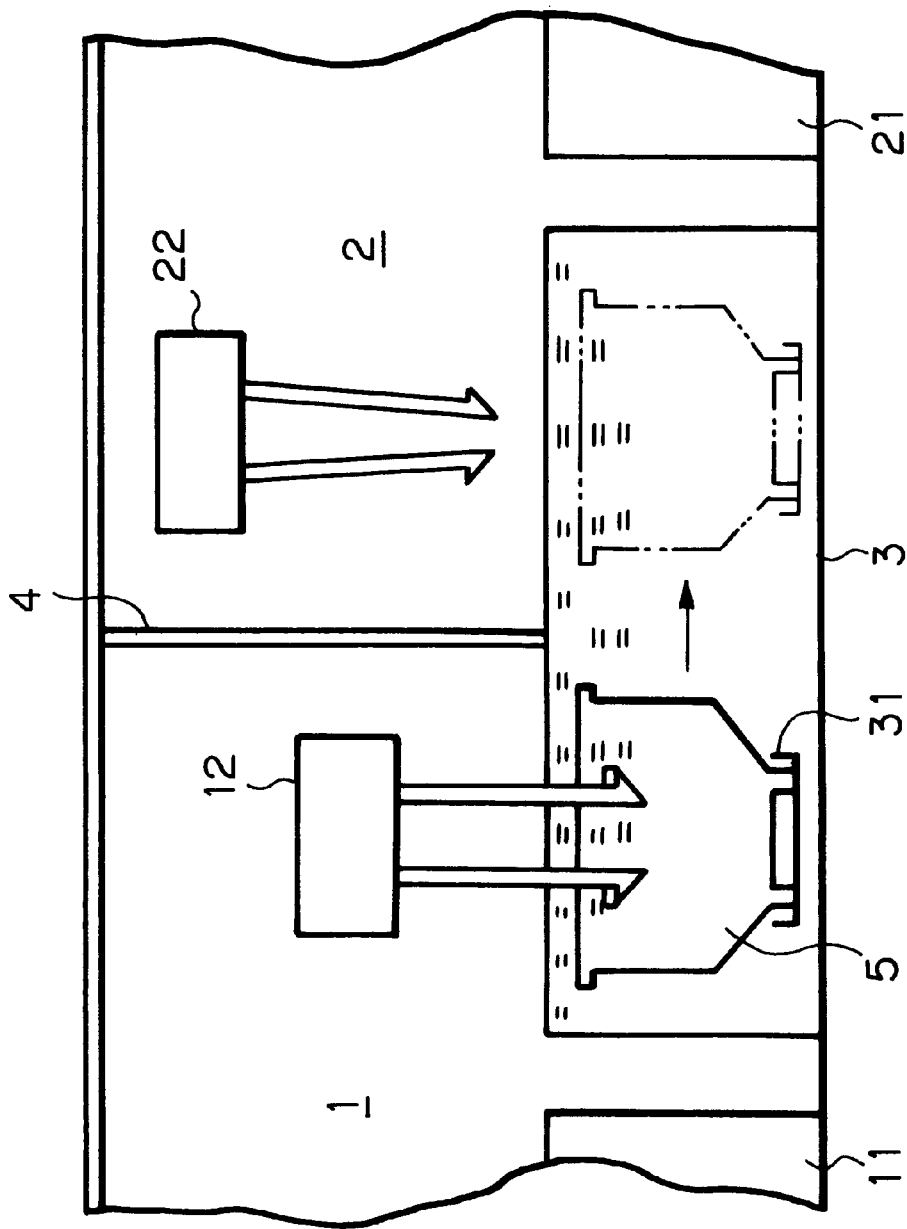
FIG. 1 is a diagram illustrating a prior art wet processing apparatus.

In FIG. 1, reference numeral 1 designates an alkali atomsphere chamber including an alkali water cell 11 and a robot 12, and 2 designates an acid atmosphere chamber including an acid water cell 21 and a robot 22. Also, a separation cell 3 is interposed between the chamber 1 and the chamber 2 which are partitioned by a partitioning plate 4.

Pure water is always supplied to the separation cell 3, so that the pure water always overflows therefrom. In addition, the lower end of the partitioning plate 4 is immersed below the surface of pure water of the separation cell 3. Thus, the chamber 1 is completely isolated from the chamber 2, so that alkali vapor hardly invades the chamber 2, and acid vapor hardly invades the chamber 1.

Also, a movable supporting bed 31 is provided within the separation plate 3, thus supporting the wafer carrier 5.

The operation of moving a wafer carrier 5 from the chamber 1 to the chamber 2 is explained next. In this case, the supporting bed 31 is located within the separation cell 3 on the side of the chamber 1.

First, the wafer carrier 5 accommodating wafers is moved by the robot 12 from the alkali water cell 11 to the supporting bed 31. Then, the robot 12 is evacuated toward the alkali water cell 11.

Next, the supporting bed 31 is moved within the separation cell 3 toward the chamber 2. As a result, the wafer carrier 5 is placed within the separation cell 3 on the side of the chamber 2.

Finally, the wafer carrier 5 is moved by the robot 22 from the separation cell 3' to the acid water cell 21.

In the wet processing apparatus of FIG. 1, since the wafer carrier 5 has to be moved within the separation cell 3 from the chamber 1 to the chamber 2 or vice versa, the separation cell 3 is large in size. For example, the width of the separation cell 3 is as much as two times larger than that of the wafer carrier 5. This increases consumption of pure water. Particularly, when the diameter of wafers is very large, such as 200 m to 300 m, the consumption of pure water is remarkably increased.

In addition, the motion of the movable supporting bed 31 within the separation cell 3 generates static electricity between the wafers and pure water having a large specific resistance, so that the wafers are charged which destroys the function thereof.

Figure 2A:
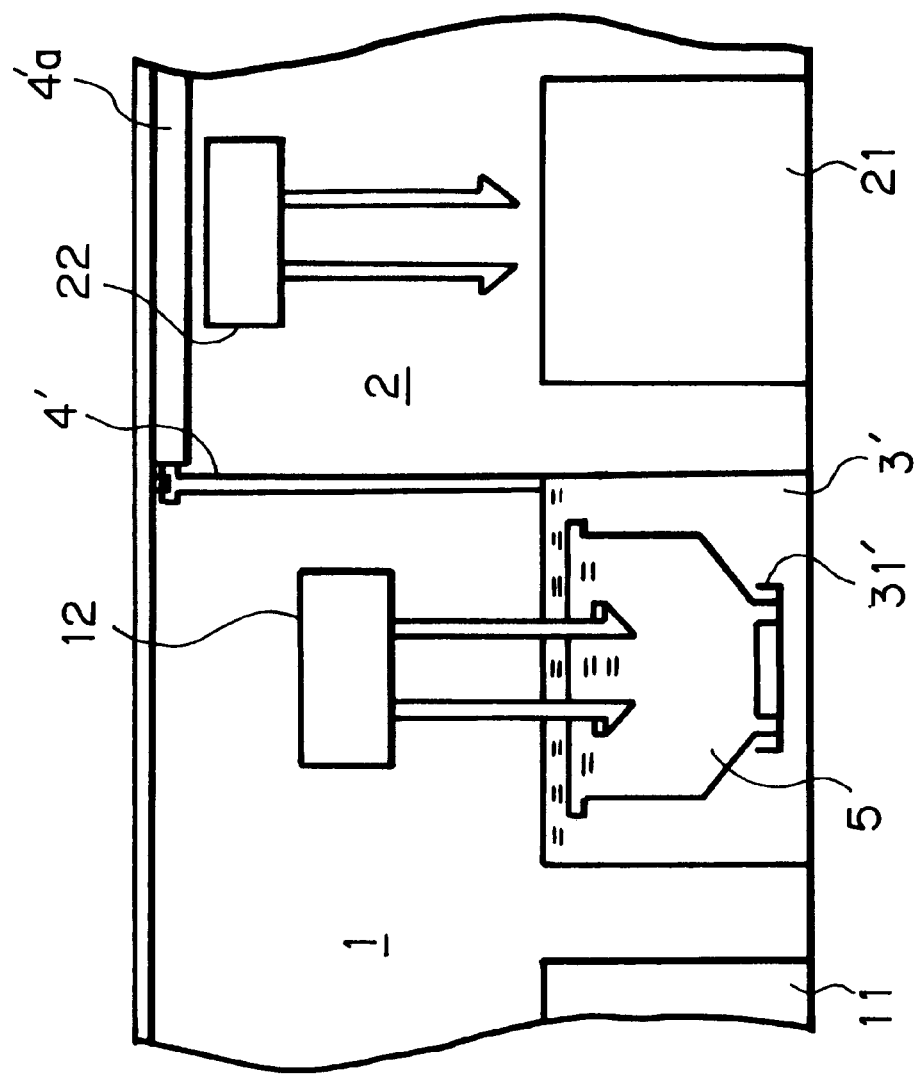

In FIGS. 2A, 2B and 2C, which illustrate an embodiment of the present invention, the separation cell 3 of FIG. 1 is modified to a separation cell 3' which is smaller than the separation cell 3 of FIG. 1. In this case, the separation cell 3' is about half of the separation cell 3 of FIG. 1. Also, a supporting bed 31' fixed to the separation cell 3' is provided instead of the movable supporting bed 31 of FIG. 1.

Further, a movable partitioning plate 4' is provided instead of the partitioning plate 4 of FIG. 1. The movable partitioning plate 4' is moved by a movable mechanism 4'a driven by an air cylinder or an oil cylinder (not shown). In this case, the movable mechanism 4'a is covered by bellows.

The operation of moving a wafer carrier 5 from the chamber 1 to the chamber 2 is explained next. In this case, the partitioning plate 4' is located at an edge of the separation cell 3 on the side of the chamber 2.

First, as illustrated in FIG. 2A, the wafer carrier 5 accommodating wafers is moved by the robot 12 from the alkali water cell 11 to the supporting bed 31'. Then, the robot 12 is evacuated toward the alkali water cell 11. In this state, the separation cell 3' is in an alkali atmosphere.

Next, as illustrated in FIG. 2B, the movable partitioning plate 4' is moved to the edge of the separation cell 3' on the side of the chamber 1, while the lower edge of the movable partitioning plate 4' is immersed below the surface of the separation cell 3'. As a result, the separation cell 3' is transferred from the alkali atmosphere to an acid atmosphere.

Finally, as illustrated in FIG. 2C, the wafer carrier 5 is moved by the robot 22 from the separation cell 3' to the acid water cell 21.

Figure 3:
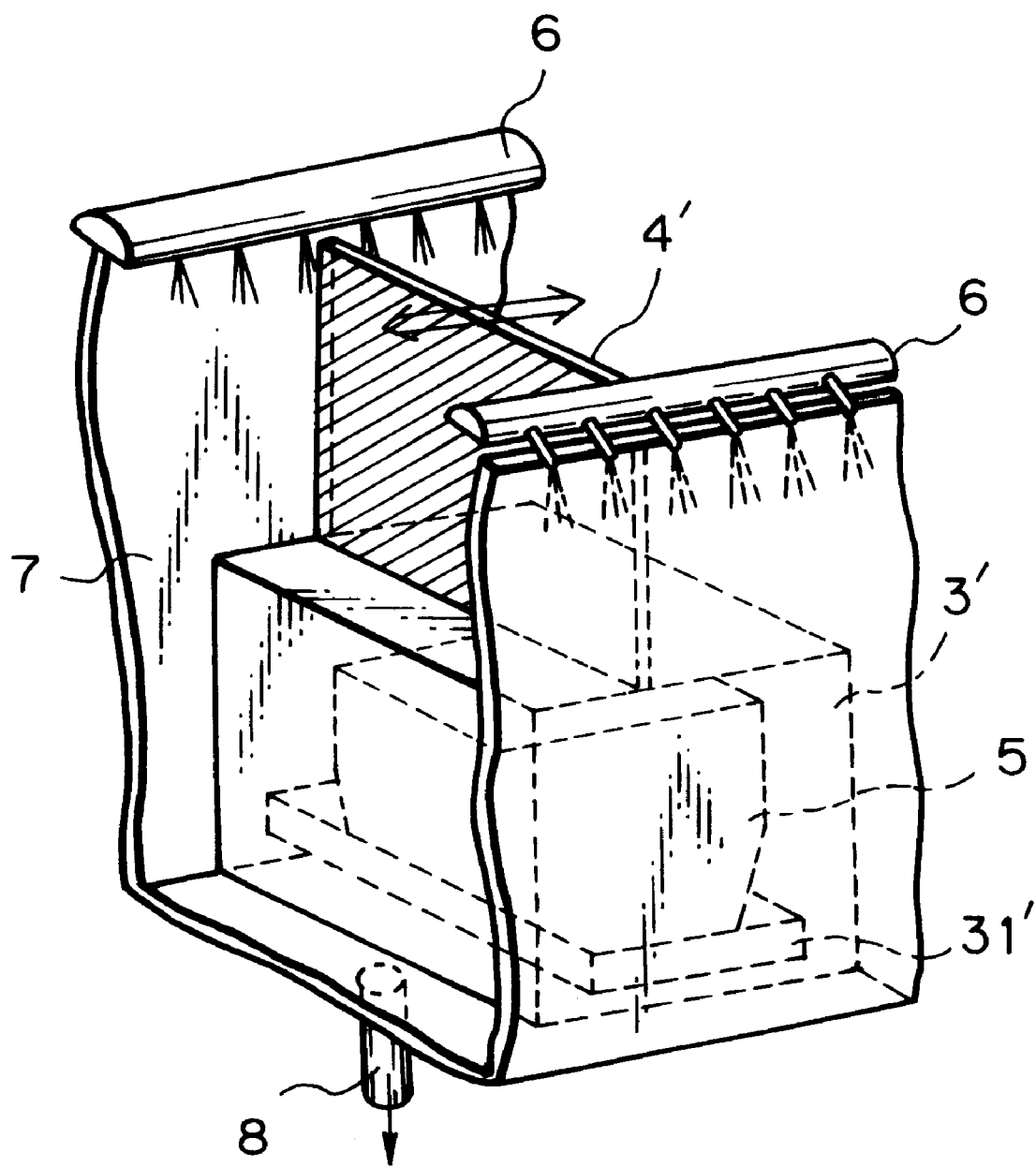
FIG. 3 is a partly-cut perspective view of the apparatus of FIGS. 2A, 2B and 2C.

In FIG. 3, which is a partly-cut perspective view of the apparatus of FIGS. 2A, 2B and 2C, cleaning shower units 6 are provided on the tops of walls 7 surrounding the separation cell 3'. The cleaning shower units 6 inject pure water to the inner faces of the walls 7, so that alkali or acid material adhered thereto is washed with the pure water. In addition, the pure water is exhausted from a drain pipe 8. Thus, even when alkali material and acid material are alternately adhered to the walls 7 and are alternately evaporated therefrom, the alkali material hardly mixes with the acid material.

Figure 4:
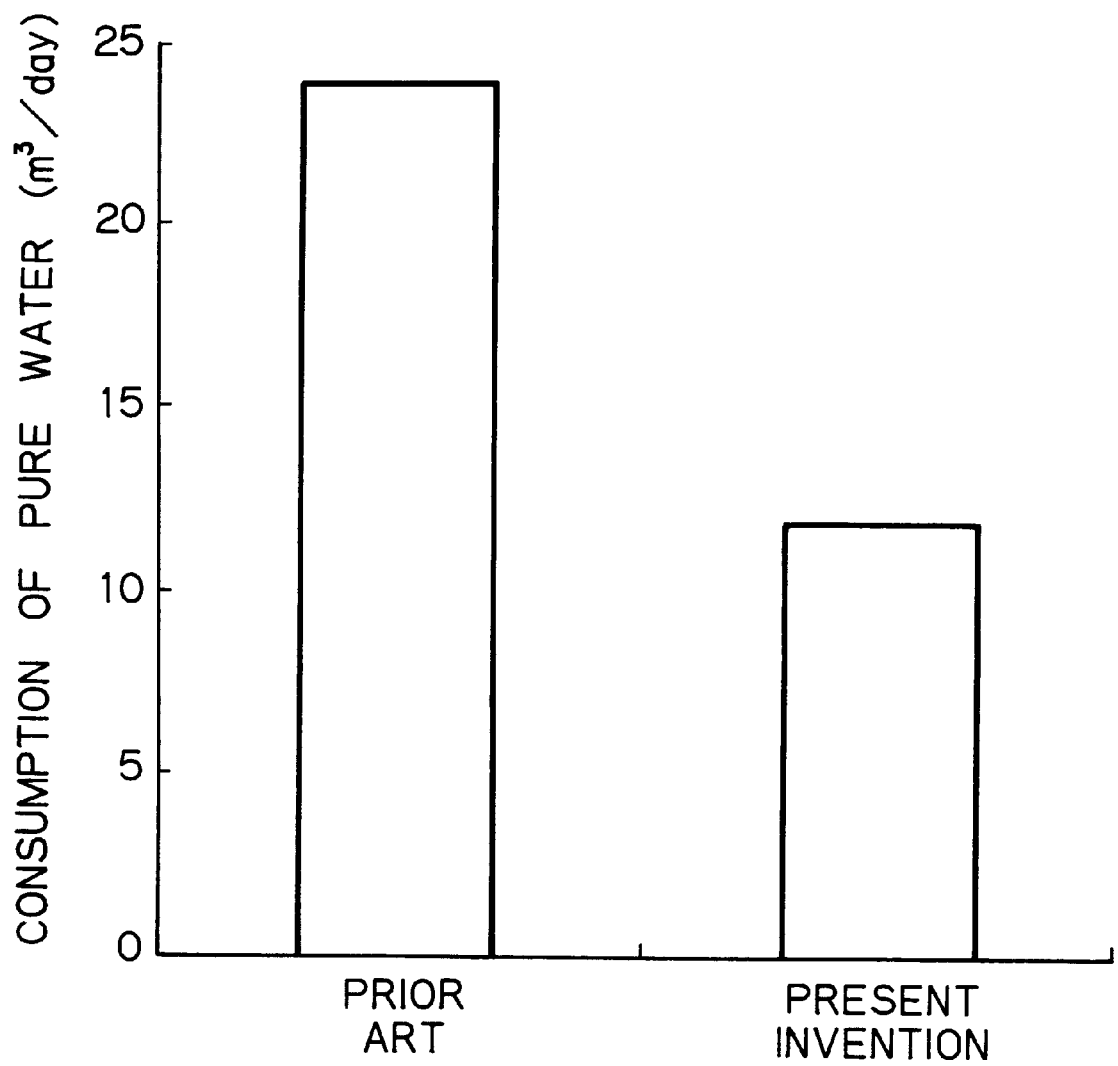
FIG. 4 is a graph showing the effect of the present invention as compared with the prior art.

In FIG. 4, which shows consumption of pure water supplied to the wet processing apparatuses of FIGS. 1 and FIG. 2A (2B, 2C), the consumption of pure water by the apparatus of FIG. 2A (2B, 2C) can be remarkably reduced as compared with that by the apparatus of FIG. 1.

As explained hereinabove, according to the present invention, since the separation cell can be reduced in size, the consumption of pure water can be reduced. In addition, since the plate for supporting the wafer carrier is fixed to the separation cell, the wafers are hardly charged, so that the function thereof is hardly destroyed.

I claim:

1. A wet processing apparatus comprising:

a first processing chamber for carrying out a first process with first chemicals;

a second processing chamber for carrying out a second process with second chemicals;

a separation cell, provided between said first and second processing chambers, for receiving pure water therein and a movable partitioning plate, provided between said first and second processing chambers, for partitioning said first processing chamber from said second processing chamber, a lower end of said movable partitioning plate being immersed below a surface of pure water of said separation cell.

2. The apparatus as set forth in claim 1, wherein a movable mechanism of said movable partitioning plate is covered by bellows.

3. The apparatus as set forth in claim 1, further comprising:

walls for surrounding said separation cell; and cleaning shower units for injecting pure water to inner faces of said walls.

4. The apparatus as set forth in claim 3, wherein said clearing shower units are mounted at tops of said walls.

5. The apparatus as set forth in claim 1, further comprising a supporting bed, fixed to said separation cell, for supporting a carrier.

* * * * *